(12) United States Patent
Kim et al.

(10) Patent No.: US 8,030,449 B2
(45) Date of Patent: Oct. 4, 2011

(54) PRESSURE CRYOCOOLING PROTEIN CRYSTALS

(75) Inventors: Chae Un Kim, Ithaca, NY (US); Sol M. Gruner, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 11/700,237

(22) Filed: Jan. 31, 2007

(65) Prior Publication Data

US 2007/0179282 A1     Aug. 2, 2007

Related U.S. Application Data

(60) Provisional application No. 60/763,367, filed on Jan. 31, 2006.

(51) Int. Cl.
*C07K 1/00* (2006.01)
*G01N 31/00* (2006.01)

(52) U.S. Cl. .......................................... 530/350; 702/27

(58) Field of Classification Search ........................ None
See application file for complete search history.

(56) References Cited

OTHER PUBLICATIONS

Cohen et al., MAD phasing with krypton, 2001, Acta Cryst. vol. D57, pp. 233-238.*
Schiltz et al., Use of Noble Gases Xenon and Krypton as Heavy Atoms in Protein Structure Determination, 2003, Method of Enzymol., vol. 374, pp. 83-119.*
Thomanek et al., Freezing of Myoglobin Crystals at High Pressure, 1972, Acta Cryst., vol A29, pp. 263-265.*
Urayama et al., Probing Substates in Sperm Whale Myoglobin Using High-Pressure Crystallography, Structure, 2002, vol. 10, pp. 51-60.*
Hunter et al., Protein recognition o fmacrocycles: Binding of anti-HIV metallocyclams to lysozyme., PNAS, Feb. 15, 2005, vol. 102, pp. 2288-2292.*
Johnson, Harold A., Simple Helium Enclosure for Increasing Diffraction-Line Detectability with a G.E. XRD-5 Diffractometer., Appl. Spectrosc., 1968, 22, pp. 211-212.*
Nicholson et al., High pressure applications in structural molecular biology., Recent Res. Devel. Mol. Biol, 2006, vol. 81, pp. 1-15.*
Kalinin et al., Crystal growth in X-ray-transparent plastic tubing: an alternatie for high-throughput applications., Acta Crystallographica, 2005, vol. D61, pp. 1528-1532.*
Giege et al. Crystallogenesis of Biological Macromolecules: Facts and Perspectives. Acta Cryst., (1994) D50: 339-350.*
Branden et al (1999) Introduction to Protein Structure, Second Edition, Garland Publishing Inc., New York, pp. 374-375 and 382.*
Drenth, Principles of Protein X-ray Crystallography (1995) Springer, New York, p. 1.*
Kierzek et al., Models of protein crystal growth, (2001) Biophys Chem, 91:1-20.*
Wiencek, New Strategies for Protein Crystal Growth, (1999) Ann Rev Biomed Eng., 1:505-534.*
Roger B. Gregory, Protein-solvent interactions, 1995, CRS Press, Edition illustrated, p. 144.*
Kim, Chae-Un, et al., "High-Pressure Cooling of Protein Crystals Without Cryoprotectants", Acta Cryst. D61, 881-890 (2005).
Kim, Chae-Un, et al., "Solution of Protein Crystallographic Structures by High-Pressure Cryocooling and Noble-Gas Phasing", Acta Cryst. D62, 687-694 (2006).
Albright, Ronald A., et al., "The RCK Domain of the KtrAB K+ Transporter: Multiple Conformations of an Octameric Ring", Cell 126, 1147-1159 Sep. 22, 2006.

* cited by examiner

*Primary Examiner* — Alexander Kim
(74) *Attorney, Agent, or Firm* — Hodgson Russ LLP

(57) ABSTRACT

Preparation of cryocooled protein crystal is provided by use of helium pressurizing and cryocooling to obtain cryocooled protein crystal allowing collection of high resolution data and by heavier noble gas (krypton or xenon) binding followed by helium pressurizing and cryocooling to obtain cryocooled protein crystal for collection of high resolution data and SAD phasing simultaneously. The helium pressurizing is carried out on crystal coated to prevent dehydration or on crystal grown in aqueous solution in a capillary.

20 Claims, No Drawings

PRESSURE CRYOCOOLING PROTEIN CRYSTALS

CROSS-REFERENCE TO RELATED APPLICATION

This application claims the benefit of U.S. Provisional Patent Application No. 60/763,367, filed Jan. 31, 2006, the whole of which is incorporated herein by reference.

This invention was made with U.S. Government support under National Institutes of Health Grant No. RR 01646, under National Science Foundation and National Institutes of Health (National Institute of General Medical Sciences) Grant No. DMR-0225180, National Institutes of Health Grant No. GM074899, and U.S. Department of Energy Grant No. DEFG02-97ER62443. The U.S. Government has certain rights in the invention.

FIELD OF THE INVENTION

This invention is directed to obtaining cryocooled protein crystals to improve collection of high resolution data in two embodiments and for allowing collection of high resolution data and single anomalous diffraction (SAD) phasing in another embodiment.

BACKGROUND OF THE INVENTION

A typical protein crystal at room temperature only survives a fraction of the X-ray dose required for a complete high-resolution data set before it becomes irrevocably radiation-damaged. To inhibit the occurrence of radiation damage, protein crystals containing water surrounding and inside the crystals are typically flash cooled at atmospheric pressure. The goal is to obtain amorphous ice rather than crystalline ice and to reduce the damage on the crystal by the cryofreezing process. Cryoprotectants are typically added to promote the result. In practice, cryoprotectants that work with one protein do not work with another, requiring a trial-and-error search. This process is time consuming and in some cases unsuccessful.

SUMMARY OF THE INVENTION

It has been discovered herein that cryocooling under noble gas pressurization facilitates effective cryoprotection, thereby minimizing or eliminating need for penetrative cryoprotectants.

In a first embodiment of the invention herein, there is provided a method for cryoprotection of a protein, e.g., a membrane protein or a water-soluble protein, crystal containing water surrounding and inside the crystal, which provides cryocooled crystal which permits obtaining high resolution data by X-ray crystallography analysis.

The method comprises the steps of (a) coating the crystal to prevent dehydration, (b) pressurizing the crystal with noble gas, e.g., helium gas, to a pressure ranging from 100 to 300 MPa or even to 800 MPa at a temperature ranging from just above water freezing temperature to room temperature or higher, e.g., 5 to 20° C., for a time period sufficient for the crystal to equilibrate, for example, 10 to 45 minutes, (c) cooling the noble gas pressurized crystal to below 120 K, e.g., to 77 K, and (d) releasing the noble gas pressure, and maintaining the crystal at cryogenic temperature for X-ray analysis.

In a second embodiment, the method is the same as the first except that step (a), the coating step, is omitted, and instead the method is carried out in a plastic capillary. In this embodiment, the method comprises
 (a) growing a crystal in aqueous solution, in a capillary,
 (b) pressurizing the capillary and crystal grown in solution with a noble gas, e.g., helium gas, to a pressure ranging from 100 to 800 MPa, for example, 100 to 300 MPa, for a time period sufficient for the crystal to equilibrate, e.g., 10 to 45 minutes,
 (c) cooling the noble gas pressurized capillary and crystal in solution to below 120 K, e.g. to 77 K, and
 (d) releasing the noble gas pressure, and maintaining the crystal in solution in the capillary for x-ray analysis.

In a third embodiment herein, there is provided a method for producing a cryocooled protein, e.g., a membrane protein or a water-soluble protein, crystal for obtaining high resolution data and obtaining phase information by single anomalous diffraction (SAD) simultaneously, said method comprising the steps of (a) providing a protein crystal which contains water surrounding and inside it; (b) coating the crystal to prevent dehydration; (c) pressurizing the crystal at ambient temperature with a heavier noble gas, e.g., heavier than neon, e.g., heavier than argon, e.g., krypton or xenon, which has binding sites in the crystal at a pressure sufficient to obtain binding by the noble gas to produce a sufficient anomalous signal for phasing, e.g. to 0.1 to 20 MPa; (d) releasing the pressure implemented in step (c); (e) pressurizing the heavier noble gas bound crystal with helium gas, to a pressure ranging from about 100 to 300 MPa or even to 800 MPa at a temperature ranging from just above water freezing temperature to room temperature or higher, e.g., 5 to 20° C., for example, for a time period ranging from 1 to 10 minutes; (f) cooling the pressurized heavier noble gas bound crystal to below 120 K, e.g., to 77 K (e.g. using $LN_2$); and (g) releasing the gas pressure imparted in step (e) and maintaining the temperature of the crystal at cryogenic temperature for X-ray analysis.

In one case of the third embodiment, the heavier noble gas for step (c) is krypton and the pressure established in step (c) ranges from 1 to 10 MPa.

In another case of the third embodiment, the heavier noble gas for step (c) is xenon and the pressure established in step (c) ranges from 0.3 MPa to 4 MPa.

As used herein, the term "membrane protein" is a protein molecule that is attached to, or associated with, the membrane of a cell or an organelle and includes integral membrane proteins and peripheral membrane proteins.

DETAILED DESCRIPTION

We turn now to the first embodiment herein.

Apparatus suitable for carrying out the method is described in Kim, C. U., Kapfer, R. and Gruner, S. M., Acta Cryst. D61, 881-890 (2005).

The coating of step (a) can be carried out with an immersion oil, e.g., NVH oil (catalog No. HR3-617, Hampton Research, Laguna Niguel, Calif., USA). The immersion oil is not a penetrative cryoprotectant. It can be the oil used in microscope work or any other oil that is hydrophobic. Oil around protein crystals almost always cannot diffuse into the protein crystal due to water-oil repulsion because of the water in the crystal. Protein crystals can get damaged upon cooling because the water inside the crystal (protein crystals, on average, consist of 50% water) disrupts the crystal upon solidification. Penetrative cryoprotectant penetrates the crystal and is conventionally used to reduce such damage. The immersion oil herein is not a penetrative cryoprotectant and does not penetrate the crystal but is to coat the crystal to prevent dehydration of protein crystal during pressurizing and cryocooling since loss of water from the crystal degrades the crystal.

The pressurizing of step (b) was carried out in experiments at 10° C. It is necessary that the pressurizing is carried out on unfrozen crystals. It is advantageous to start at the temperature at which the crystals are grown.

A 77 K for steps (c) and (d) can be obtained using liquid nitrogen ($LN_2$). Other temperatures typical of cryocooling are also permitted.

The pressurizing of step (c) has been carried out for glucose isomerase at 130 MPa, for thaumatin at 185 MPa, for L-amino oxidase at 190 MPa, for CO-hemoglobin (carbon monoxide attached to hemoglobin) at 185 MPa, for yellow fluorescent protein (YPP) citrine variant, at 192 MPa, for cyclooxygenase at 150 MPa, for glucose isomerase grown with mannosylphosphododichol synthase (MPD) at 130 MPa and 190 MPa and for lysozyme from bacteriophage T4 (T4 lysozyme) at 150 MPa.

For data collected at 110 K ($N_2$-gas stream) and oscillation angle at 1.0°, results were as follows for invention versus flash cooling at atmosphere pressure: glucose isomerase (resolution of 1.1 or 1.3 angstroms and mosaicity of 0.39° or 0.48° versus resolution of 5.0 angstroms); thaumatin (resolution of 1.15 angstroms or 1.35 angstroms and mosaicity of 0.11° or 0.33° versus resolution of 1.8 or 1.93 angstroms and of 1.8 or 1.93 angstroms and mosaicity of 1.29° or 1.43°); L-amino acid oxidase (resolution of 2.7 angstroms and mosaicity of 0.56° or 0.59° versus resolution of 7.0 angstroms); for CO-hemoglobin (resolution at 1.5 or 1.6 angstroms and mosaicity of 0.27° or 0.32° versus resolution of 1.9 or 1.95 angstroms and mosaicity of 0.32° or 0.51°); for YFP citrine variant (resolution of 1.30 angstroms and mosaicity of 0.07° versus resolution of 1.85 angstroms and mosaicity of 0.6°), for cyclooxygenase (resolution of 5.8 angstroms versus resolution of 6.0 angstroms); for glucose isomerase grown with MPD (resolution of 1.2 angstroms and mosaicity of 0.33° versus resolution of 1.2 angstroms and mosaicity of 0.37°), for T4 lysozyme (resolution of 1.20 angstroms and mosaicity of 0.24° or 0.34° versus resolution of 1.7 angstroms and mosaicity of 0.49° or 0.68°). The pressure is preferably selected to promote formation of amorphous ice and provide the best resolution and mosaicity.

Description and data of the first embodiment described above is presented in Kim, C. U., Kapfer, R. and Gruner, S. M., Acta Cryst. D61, 881-890 (2005).

The level of structural perturbation induced by pressure cooling was found to be small (a few tenths of an angstrom) and of the same magnitude as induced by cooling to cryogenic temperatures at atmosphere pressure.

We turn now to the second embodiment herein.

The capillary can be made, for example, of polycarbonate (PCN), polytetrafluoroethylene (PTFE), perfluoroalkoxy (PFA) or glass.

The thickness of the capillary wall can range, for example, from 0.05 to 0.5 mm.

In experiments supporting the invention capillaries used were of PCN (inside diameter of 0.3 mm, outside diameter of 0.9 mm, wall thickness of 0.3 mm), of PTFE (inside diameter of 0.3 mm, outside diameter of 0.51 mm, wall thickness of 0.1 mm), and of PFA (inside diameter of 0.38 mm, outside diameter of 0.84 mm, and wall thickness of 0.23 mm).

In experiments supporting the method of the second embodiment, a piece of wire was inserted into one end of the capillary, the capillaries were filled with mother solution and then the capillaries were inserted into brass tubing for pressure freezing.

Experiments supporting the invention herein were carried out with thaumatin and glucose isomerase in aqueous mother solutions (0.9 M sodium potassium tartrate for thaumatin and 1.15 M ammonium sulfate for glucose isomerase) in the PCN capillary.

In an experiment herein, thaumatin was grown in the PCN capillary and pressurizing was carried out with helium gas to 1.97 kbar (197 MPa) and freezing was carried out with $LN_2$. In one case, diffraction to 1.15 angstroms without ice ring formation, was obtained.

In a similar experiment, thaumatin crystals were prepared by the He high pressure cryocooling process described in Kim et al. (2005), cited above. Briefly, the polycarbonate capillary containing crystals was cut into 2 cm lengths and loaded into the high pressure cryocooling apparatus which was then pressurized with helium gas to 170 MPa. Mother liquor around crystals in the capillary was not removed so that the crystals were left fully hydrated; hence, oil coating to prevent crystal hydration was not needed. The capillary ends were left open under pressure but water evaporation from the capillary during the brief process was negligible. No additional penetrating cryoprotectants were added to the mother liquor for high pressure cryocooling. Once at high pressure, a magnetic constraint was released and the crystals fell down a length of high pressure tubing into a zone kept at $LN_2$ temperature. The helium pressure was released and the crystals were thereafter handled at low temperatures and ambient pressure for cryocrystallographic data collection.

The entire cryocooled sample looked clear, including a crystal and mother liquor in the capillary. The crystal diffraction showed no crystalline ice rings, which confirms that amorphous ice formed inside the capillary by He high pressure cryocooling. In contrast, room pressure flash cryocooling of capillary samples resulted in crystalline ice rings.

The crystallographic data statistics of the thaumatin crystal are summarized in Table I below. The refined crystallographic structure was solved by molecular replacement method with the known structure 1LXZ (Charron, C., et al., Acta Cryst. D58, 2060-2065 (2002).). With the calculated phases, an anomalous difference map was generated at 1.9 angstroms to check the anomalous signals from sulfur atoms. In the map, all 17 sulfurs could be clearly distinguished and maximum peak height was higher than $10\sigma$ at most of the sulfur sites.

TABLE 1

|  | Thaumatin |
|---|---|
| High Pressure cryocooling | Helium |
| Wavelength (Å) | 1.7433 |
| Space group | P42121 |
| Unit-cell parameters (Å) | |
| a(Å) | 57.968 |
| b(Å) | 57.968 |
| c(Å) | 1-50.6716 |
| Solvent content (%) | 56.9 |
| Mosaicity(°) | 0.34 |
| Resolution range (Å) | 30-1.9 (1.97-1.9) |
| No. of observations | 469249 |
| No. of unique reflections* | 38263 |
| Multiplicity* | 12.3 (3.5) |
| Completeness (%)* | 99.4 (93.9) |
| $R_{sym}$ (%)* | 8.9 (17.5) |
| I/σ(I) | 32.0 (5.0) |
| R value (%) | 17.6 |
| $R_{free}$ value (%) | 21.6 |

TABLE 1-continued

| | Thaumatin |
|---|---|
| Average B factor (Å$^2$) | 17.1 |
| No. of water molecules | 401 |
| R.m.s. deviation from ideality | |
| Bond lengths (Å) | 0.014 |
| Angles(°) | 1.322 |
| Xenon occupancy | N/A |
| Xenon B factor (Å$^2$) | N/A |

*The Bijvoet pairs are kept separate in the statistics.

De novo S SAD phasing was then carried out to determine if the diffraction could be phased without a known structure. In the anomalous substructure, all 17 sulfur atom positions could be resolved at 1.9 angstrom resolution. The map correlation coefficients between the Fo map at 1.9 angstroms and the 2Fo-Fc map from the final refined model were 0.82 for main chain and 0.75 for side chain. In auto model building process, 95% of total residues (197 out of 207) could be found and docked in the electron density. S SAD phasing at different resolutions was straightforward up to 2.1 angstroms and partial structure could be found and docked at 2.2 angstroms and 2.3 angstroms.

In summary, high pressure cryocooling was applied successfully to a thaumatin crystal and mother liquor in a polycarbonate capillary. The entire system could be vitrified. The diffraction quality was sufficiently good that S SAD phasing was successfully performed.

In an experiment herein, glucose isomerase was grown in aqueous mother solution in the PCN capillary with pressure freezing (with pressurizing with helium gas and freezing with LN$_2$) at 1.9 kbar (190 MPa). In one case, the mother liquor was entirely vitrified so no ice rings were observed and the resolution reached about 2 angstroms.

In an experiment supporting the method of the second embodiment, the thaumatin grown in aqueous mother solution in the PTFE capillary was pressure frozen. Pressurizing was carried out with helium gas at 1.96 kbar (196 MPa). Freezing was with LN$_2$. Crystal diffraction was observed with quality comparable to the case of oil coated pressure—cooled crystals. When freezing was carried out at ambient pressure, the crystal is barely seen in the target area and diffraction is very poor and strong water ice rings are also seen.

In an experiment supporting the method of the second embodiment, the thaumatin grown in aqueous mother solution in the PTFE capillary was pressure frozen at 1.96 kbar (196 MPa). Pressurizing was with helium gas and freezing was with LN$_2$). X-rays were focused on the crystal. Crystal diffraction was carried out with quality comparable to what was obtained for oil-coated pressure-cooled crystal, with no ice rings.

Collection of high resolution data is important because it allows definition of the protein structure which is important to understanding the protein's function and allows development of drugs based on the protein structure. The smaller the resolution measurement, the more accurately the protein structure can be defined.

The resolution refers to the smallest detail that can be seen in the structure. For example, at about 5 to 6 angstroms resolution, the overall shape of a protein can barely be seen. At about 3 to 4 angstroms resolution, details of the structure can start to be observed. At 2 angstroms, most of the original amino acids are distinguished. At about 1 angstrom, most of the individual atoms in a protein are clearly distinguished and visible. Therefore the higher the resolution (the smaller the smallest detail that can be seen in terms of angstroms), the better the protein structure can be determined.

The mosiacity is a measure of protein crystal quality. If the mosaicity of a data set is high, some resolution is lost and data analysis to solve the protein structure is more problematic. Lower mosaicity is always preferred.

We turn now to the third embodiment herein.

The third embodiment enables obtaining cryoprotection for high quality data (high resolution data and low mosaicity) and obtaining phase information simultaneously.

Apparatus is the same as with the first embodiment except as described in Kim, C. U., Hao, Q. and Gruner, S. M., Acta Cryst. D62, 687-694 (2006), the whole of which is incorporated herein by reference.

The coating of step (b) can be carried out with an immersion oil.

The pressurizing of step (c) is, for example, from 5 minutes to 2 hours.

The pressurizing of step (e) is carried out, for example, over a period of at most a few minutes to limit the escape of krypton.

Description and data and Working Examples supporting the third embodiment using krypton in step (c) are disclosed in Kim, C. U., Hao, Q. and Gruner, S. M., Acta Cryst. D62, 687-694 (2006). Data were obtained in porcine pancreas elastase (PPE). Lyophilized PPE (catalog No. 20929) purchased from SERVA (Heidelberg, Germany) was used to obtain data. Crystals were grown by the hanging drop method by mixing 2 μl reservoir solution containing 30 mM sodium sulfate and 50 mM sodium acetate pH of 5.0 with 2 μL of 25 mg ml$^{-1}$ protein solution in pure water. Crystals appeared in a few days and crystals of dimensions 0.1×0.1×0.2 mm were used in the Kr—He high pressure cryocooling experiments. Crystals were picked up in a cryoloop in a droplet of Hampton Research NVH oil. The oil-coated crystals were loaded into the cryocooling apparatus, which was then pressurized to a pressure in the 100-200 MPa ranges. Once at high pressure a magnetic constraint is released and crystals fall down a length of high pressure tubing into a cold zone kept at liquid-nitrogen temperature. The helium pressure is released and the crystals are handled thereafter at ambient pressure, for cryocrystallographed data collection.

Data was collected as set forth in paragraph 2.2.2 of Kim, C. U., Hao, Q. and Gruner, S. M., Acta Cryst. D62, 687-694 (2006), and was processed as set forth in paragraph 2.3.2 of that article and the summary of results crystallographic statistics are set forth in Table 2 of that article. The superior diffraction obtained as shown in said Table 2 was comparable to that of the PPE crystals prepared by successful flash cryocooling at ambient pressure with 20% glycerol as cryoprotecting agent.

SAD phasing was successfully carried out on KrHe_3 (see Table 2) and results are shown in Table 3 of the Kim/Hao/Gruner article referenced above.

Since Kr SAD phasing was successful, it was decided to experiment with substituting xenon for krypton since xenon has stronger protein binding than krypton and since xenon seems to bind to proteins more slowly and in reverse diffuses out more slowly, than krypton.

We turn now to the work with xenon.

In experiments supporting use of xenon, PPE crystals as above were coated with NVH oil (Hampton Research) and loaded into high pressure tubes that were then connected to a gas compressor. The crystals were initially pressurized with xenon gas to 1.0 MPa. After 15 minutes, the compressed xenon gas was released, liquid nitrogen was poured into the LN$_2$ bath of the cryocooling apparatus, and the crystals were re-pressurized with helium. After 60 seconds, helium pressures reached 145 MPa and the crystals were cryocooled to $LN_2$ temperature at the 145 MPa pressure. Overall, the time from xenon pressure release to cryocooling was 150 seconds. The helium pressure was released 2 minutes after cryocooling and the crystals were transferred into a cryocup under liquid nitrogen for data collection.

Diffraction data were collected at the Cornell High Energy Synchrotron Source (CHESS) on beamline F2 (beam diameter=150 μm, ADSC Quantum-210 CCD detector). In all cases the detector face was perpendicular to the incident beam. All data were collected at 110 K (N2 gas stream) and ambient pressure with oscillation angle of 1.0° per image. In order to obtain useful anomalous signals from xenon and sulfur, the x-ray energy was located and calibrated at iron K edge (7.11 keV), where the anomalous strengths of xenon and sulfur are 9.0 e and 0.7 e, respectively. Diffraction data were collected by the inverse-beam mode with a wedge of 10 frames. The distance between crystal and detector was 65 mm for PPE and 95 mm for thaumatin. The exposure time for each frame was 2 min for PPE and 5 min for thaumatin. A total of 360 frames were collected from each crystal.

Data were indexed, pre-refined, integrated, post-refined, scaled and merged with HKL2000 (Otwinowski & Minor, 1997) with the 'scale anomalous' flag to keep Bijvoet pairs separate. The initial structures were determined by molecular replacement method using MOLREP (Vagin & Teplyakov, 1997) from the CCP4 program suite (Collaborative Computational Project, Number 4, 1994)). The structures were then refined against the data set with REFMAC5 (Murshudov et al., 1997). As xenon occupancy and thermal B factor are highly correlated, the xenon occupancy was manually adjusted so that the refined thermal B factor of the xenon atom was close to the average thermal B factor of the crystallographically refined main chain atoms. In SAD phasing, the anomalous scattering substructure was initially solved and refined using the program SAPI (Hao et al., J. Appl. Cryst. 36, 1274-1276 (2003)) and ABS (Hao, J. Appl. Cryst. 37, 498-499). The heavy atom position was then input into OASIS-2004 (Wang et al., Acta Cryst. D60, 1244-1253 (2004)) for de novo SAD phasing. Afterwards, density modification was performed using DM (Cowtan, Protein Crystallogr. 31, 34-38 (1994)). Auto-model building was performed with ARP/wARP (Perrakis et al., Nature Struct. Biol. 6, 458-463 (1999)) and REFMAC5 (Murshudov et al., Acta Cryst. D53, 240-255 (1997)) was used for refinement. The electron density maps and structural images were generated with PyMol (DeLano, W., PyMol., Delano Scientific, San Carlos, Calif., U.S.A., 2002).

The crystallographic data statistics for the PPE crystal prepared by the Xe—He high pressure cyrocooling are summarized in Table II below.

TABLE II

| | PPE |
|---|---|
| High Pressure cryocooling | Xenon/Helium |
| Wavelength (Å) | 1.7463 |
| Space group | $P2_12_12_1$ |
| Unit-cell parameters (Å) | |
| a(Å) | 50.153 |
| b(Å) | 58.166 |
| c(Å) | 74.658 |
| Solvent content (%) | 40.8 |
| Mosaicity(°) | 0.33 |
| Resolution range (Å) | 30-1.8 (1.86-1.8) |
| No. of observations | 281537 |

TABLE II-continued

| | PPE |
|---|---|
| No. of unique reflections* | 38238 |
| Multiplicity* | 7.4 (6.6) |
| Completeness (%)* | 97.7 (94.8) |
| $R_{sym}$ (%)* | 11.2 (26.8) |
| I/σ(I) | 19.5 (4.6) |
| R value (%) | 17.8 |
| $R_{free}$ value (%) | 22.6 |
| Average B factor (Å$^2$) | 14.6 |
| No. of water molecules | 327 |
| R.m.s. deviation from ideality | |
| Bond lengths (Å) | 0.014 |
| Angles(°) | 1.387 |
| Xenon occupancy | 0.70 |
| Xenon B factor (Å$^2$) | 11.8 |

*The Bijvoet pairs are kept separate in the statistics.

As shown in Table II, the mosaicity was 0.33 degrees, whereas the mosaicity of conventional (ambient pressure) flash cooled PPE crystals without penetrating cryoprotectants was approximately 1 degree.

Xe SAD phasing was then carried out without the use of known crystal structures. An Fo map was generated at 1.8 angstrom resolution and the final refined model solved by molecular replacement method was superimposed to visually evaluate the map quality. The map correlation coefficients between the Fo map and the 2Fo-Fc map from the final refined model for main chain and side chain were 0.83 and 0.74, respectively. In the auto model building process, 97% of total residues (232 out of 240) could be found and docked in the electron density. In order to investigate the effect of resolution on the SAD phasing, the 1.8 angstrom data set was cut off at resolutions of 1.9 angstrom, 2.0 angstrom, 2.1 angstrom and 2.2 angstrom. Auto model building was straightforward up to 1.9 angstrom and partial structure could be found and docked at 2.0 angstrom. In an anomalous difference map a very strong peak (central peak >80σ) was observed in the xenon site. Additionally, all ten sulfurs (anomalous strength of 0.7 e at 1.7643 angstrom) that are naturally present in PPE were visible at 4.5σ. These sulfur atoms were included for SAD phasing and Xe—S SAD phasing was carried out at various resolution limits. Overall, the phase quality has been slightly improved compared to Xe SAD phasing so that auto model building was straightforward up to 2.0 angstroms and a partial structure could be found and docked at 2.1 angstroms. Details of Xe SAD phasing and Xe—S SAD phasing are summarized in Table III below.

TABLE III

| | Xe SAD phasing | | | | | Xe—S SAD Phasing | | | | |
|---|---|---|---|---|---|---|---|---|---|---|
| Resolution range (Å) | 30-1.8 | 30-1.9 | 30-2.0 | 30-2.1 | 30-2.2 | 30-1.8 | 30-1.9 | 39-2.0 | 30-2.1 | 30-2.2 |
| No. of unique reflections[1] | 20337 | 17447 | 15040 | 13076 | 11434 | 20337 | 17447 | 15040 | 13076 | 11434 |
| Estimated <\|ΔF\|>/<F> (%) | 2.8 | 2.8 | 2.8 | 2.8 | 2.8 | 3.0 | 3.0 | 3.0 | 3.0 | 3.0 |
| Experimental <\|ΔF\|>/<F> (%) | 4.6 | 4.4 | 4.2 | 4.1 | 4.0 | 4.60 | 4.4 | 4.2 | 4.1 | 4.0 |
| Experimental <\|ΔF\|>/<σ(ΔF)> | 0.89 | 1.01 | 1.09 | 1.15 | 1.20 | 0.89 | 1.01 | 1.09 | 1.15 | 1.20 |
| F.O.M. after DM | 0.807 | 0.821 | 0.800 | 0.775 | 0.767 | 0.823 | 0.837 | 0.809 | 0.797 | 0.807 |
| No. of residues found | 232 | 230 | 178 | 35 | 8 | 234 | 235 | 228 | 122 | 51 |
| No. of residues docked in sequence | 232 | 230 | 133 | 0 | 0 | 234 | 235 | 228 | 21 | 0 |
| Map correlation coefficient for main chain | 0.83 | 0.81 | 0.78 | 0.74 | 0.70 | 0.85 | 0.83 | 0.80 | 0.76 | 0.71 |
| Map correlation coefficient for side chain | 0.74 | 0.71 | 0.68 | 0.64 | 0.61 | 0.76 | 0.74 | 0.71 | 0.67 | 0.63 |
| R value (%) | 22.5 | 22.3 | 24.3 | 20.7 | 18.8 | 21.6 | 21.8 | 23.0 | 21.8 | 19.0 |
| Connectivity index | 0.97 | 0.97 | 0.91 | 0.75 | 0.57 | 0.97 | 0.98 | 0.95 | 0.86 | 0.74 |

[1]The Bijvoet pairs are merged in the statistics

Xe—He high pressure cryocooling was applied to PPE and Xe SAD phasing was successfully carried out. The anomalous signal from xenon captured by Xe—He high pressure cryocooling was stronger than that of krypton captured by Kr—He high pressure cryocooling.

Variations

The foregoing description of the invention has been presented describing certain operable and preferred embodiments. It is not intended that the invention should be so limited since variations and modifications thereof will be obvious to those skilled in the art, all of which are within the spirit and scope of the invention.

What is claimed is:

1. A method for producing a cryocooled membrane or water-soluble protein crystal, comprising the steps of:
   (a) providing a membrane or water-soluble protein crystal which contains water surrounding and inside said membrane or water-soluble protein crystal,
   (b) optionally coating the crystal with immersion oil to prevent dehydration,
   (c) pressurizing the membrane or water-soluble protein crystal with helium gas at a temperature ranging above the freezing point of the water in the crystal to room temperature;
   (d) cooling the helium gas pressurized membrane or water-soluble protein crystal to below 120 K, and
   (e) releasing the helium gas pressure and maintaining the membrane or water-soluble protein crystal at a cryogenic temperature.

2. The method according to claim 1, wherein the membrane or water-soluble protein crystal is selected from the group consisting of thaumatin, L-amino acid oxidase, carbon monoxide attached to hemoglobin (CO-hemoglobin), yellow fluorescent protein (YFP) citrine variant, cyclooxygenase, glucose-isomerase, and T 4 lysozyme crystals.

3. The method according to claim 1, wherein the membrane or water-soluble protein crystal is selected from the group consisting of thaumatin and glucose-isomerase crystals.

4. The method according to claim 1, wherein the protein crystal is porcine pancreas elastase crystal.

5. The method according to claim 1, wherein the method is carried out with minimum or no cryoprotectant.

6. The method according to claim 1, wherein the method is carried out with no cryoprotectant.

7. The method according to claim 1, further comprising cooling the helium gas pressurized membrane or water-soluble protein crystal in step (d) to below 77 K.

8. The method according to claim 1, further comprising prior to step c) pressurizing the crystal at ambient temperature with a heavier noble gas which has binding sites in the crystal at a pressure sufficient to bind the noble gas and release the pressure resulting from the noble gas.

9. The method according to claim 8, the heavier noble gas is krypton and the pressure with the heavier noble gas is from 1 to 10 MPa.

10. The method according to claim 8, wherein the heavier noble gas is xenon and the pressure with the krypton ranges from 0.3 to 4 MPa.

11. The method according to claim 1, wherein the membrane or water-soluble protein crystal is in a capillary.

12. The method according to claim 1, wherein the pressure in step c) ranges from 100 to 800 MPa.

13. The method according to claim 12, further comprising prior to step c) pressurizing the crystal at ambient temperature with a heavier noble gas which has binding sites in the crystal at a pressure sufficient to bind the noble gas and releasing the pressure resulting from the noble gas.

14. The method according to claim 13, the heavier noble gas is krypton and the pressure with the heavier noble gas is from 1 to 10 MPa.

15. The method according to claim 13, wherein the heavier noble gas is xenon and the pressure with the xenon ranges from 0.3 to 4 Mpa.

16. A method for producing a cryocooled membrane or water-soluble protein crystal, comprising the steps of:
   (a) providing a membrane or water-soluble protein crystal which contains water surrounding and inside said membrane or water-soluble protein crystal,
   (b) coating the crystal with immersion oil to prevent dehydration,
   (c) (i) pressurizing the crystal at ambient temperature with a heavier noble gas selected from the group consisting of krypton and xenon which has binding sites in the crystal at a pressure sufficient to bind the heavier noble gas, (ii) releasing the pressure resulting from the noble gas, and (iii) pressurizing the membrane or water-soluble protein crystal with helium gas at a temperature ranging above the freezing point of the water in the crystal to room temperature;
   d) cooling the helium gas pressurized membrane or water-soluble protein crystal to below 77 K, and
   (e) releasing the helium gas pressure and maintaining the membrane or water-soluble protein crystal at a cryogenic temperature.

17. The method according to claim 16, wherein the membrane or water-soluble protein crystal is selected from the group consisting of thaumatin, L-amino acid oxidase, carbon monoxide attached to hemoglobin (CO-hemoglobin), yellow fluorescent protein (YFP) citrine variant, cyclooxygenase, glucose-isomerase, and T 4 lysozyme crystals.

18. The method according to claim 16, wherein the protein crystal is porcine pancreas elastase crystal.

19. The method according to claim 16, wherein the heavier noble gas has a pressure from 1 to 10 MPa.

20. A method for producing a cryocooled membrane or water-soluble protein crystal, comprising the steps of:
  (a) providing a membrane or water-soluble protein crystal which contains water surrounding and inside said membrane or water-soluble protein crystal,
  (b) coating the crystal with immersion oil to prevent dehydration,
  (c) (i) pressurizing the crystal at ambient temperature with a heavier noble gas selected from the group consisting of krypton and xenon which has binding sites in the crystal at a pressure sufficient to obtain binding by the heavier noble gas, (ii) releasing the pressure resulting from the noble gas, and (iii) pressurizing the membrane or water-soluble protein crystal with helium gas, to a pressure ranging from 100 to 800 MPa, at a temperature ranging above the freezing point of the water in the crystal to room temperature;
  (d) cooling the helium gas pressurized membrane or water-soluble protein crystal to below 77 K, and
  (e) releasing the helium gas pressure and maintaining the membrane or water-soluble protein crystal at a cryogenic temperature, and wherein the method is carried out with minimum or no cryoprotectant.

* * * * *